(12) United States Patent
Varrey et al.

(10) Patent No.: US 11,314,293 B1
(45) Date of Patent: Apr. 26, 2022

(54) LATCH FOR DEVICE WITH RULER PROFILE

(71) Applicant: ZT Group Int'l, Inc., Secaucus, NJ (US)

(72) Inventors: Maheshkumar Varrey, Secaucus, NJ (US); Chen An, Secaucus, NJ (US); Zichun Song, Secaucus, NJ (US)

(73) Assignee: ZT Group Int'l, Inc., Secaucus, NJ (US)

( * ) Notice: Subject to any disclaimer, the term of this patent is extended or adjusted under 35 U.S.C. 154(b) by 0 days.

(21) Appl. No.: 17/092,603

(22) Filed: Nov. 9, 2020

(51) Int. Cl.
*G06F 1/18* (2006.01)
*H05K 5/02* (2006.01)

(52) U.S. Cl.
CPC .............. *G06F 1/187* (2013.01); *H05K 5/023* (2013.01); *H05K 5/0221* (2013.01)

(58) Field of Classification Search
CPC ....... G06F 1/187; G06F 1/185; H05K 7/1489; H05K 5/023; H05K 7/1409; H05K 7/1402; H05K 7/1411; H05K 7/1405; H05K 5/0221; G11B 33/123; H01H 9/20
See application file for complete search history.

(56) References Cited

U.S. PATENT DOCUMENTS

| | | | |
|---|---|---|---|
| 6,774,808 B1 * | 8/2004 | Hibbs | G06F 1/184 340/686.4 |
| 7,318,532 B1 * | 1/2008 | Lee | H05K 7/1405 211/26 |
| 10,939,573 B1 * | 3/2021 | Liao | H05K 7/1409 |
| 11,134,578 B2 * | 9/2021 | Lin | H05K 5/0221 |
| 2006/0215373 A1 * | 9/2006 | Joist | H05K 7/1409 361/726 |

\* cited by examiner

*Primary Examiner* — James Wu
(74) *Attorney, Agent, or Firm* — Dergosits & Noah LLP; Todd A. Noah

(57) ABSTRACT

A latch includes a cam arm that follows a serpentine groove in the latch handle where curves of the groove create catch positions that define extended and retracted handle positions. In one of the handle positions, an arm of the handle abuts a toothed arm and urges the toothed arm to a latching position in which a tooth is extended. In the other handle position, the arm retracts from the toothed arm, allowing the tooth to retract.

13 Claims, 10 Drawing Sheets

LATCH FOR DEVICE WITH RULER PROFILE

BACKGROUND

Some electronic devices are designed so that as many as possible may be housed in a single chassis. One such design is the "ruler" design of a solid state drive (SSD), which is slid into a slot of a chassis. The chassis typically has many parallel slots, with electric connections at the rear of each slot. To retain ruler SSDs connected within the housing, the end of the SSD opposite the connection is typically equipped with a latch. FIG. 1 illustrates such a prior art latch 100 attached to a ruler SSD 106. Latch 100 includes an ejector-style hinged cam mechanism 104 integrated in a rigid handle 102, which in the industry is called a class 1 lever. Handle 102 works to lock and unlock cam mechanism 104. To install, a user pushes the ruler SSD into a chassis slot until it stops and then flips cam mechanism 104 up to a closed, latched position. This installation requires two gestures. To remove the ruler SSD, the user must release the mechanism 104 and then pull on handle 102 or mechanism 104. FIG. 2A illustrates a prior art latch 200 in an open position. In FIG. 2A, latch 200 includes rigid handle 202 and a lever 204. In FIG. 2A, lever 204 is extended, allowing a spring-loaded pin 206 (FIG. 2B) to retract. FIG. 2B is the prior art latch of FIG. 2A in a closed position. In FIG. 2B, lever 204 has been closed, causing tooth 206 to extend. When latch 200 is pushed into a slot, tooth 206 will be forced to retract by an edge of the chassis and then will snap into a window of the chassis once the ruler SSD is seated in the connector. Lever 204 is lowered to unlatch. Latches 100, 200 are typically made of mostly plastic parts and may not be suitable for all chassis designs due to EMI concerns.

Thus, what is needed is a latch that requires less manipulation to operate and that provides improved latching performance.

BRIEF DESCRIPTION OF THE DRAWINGS

The embodiments are illustrated by way of example and not limitation in the accompanying drawings, in which like references indicate similar elements, and in which.

DETAILED DESCRIPTION

Figure 1:
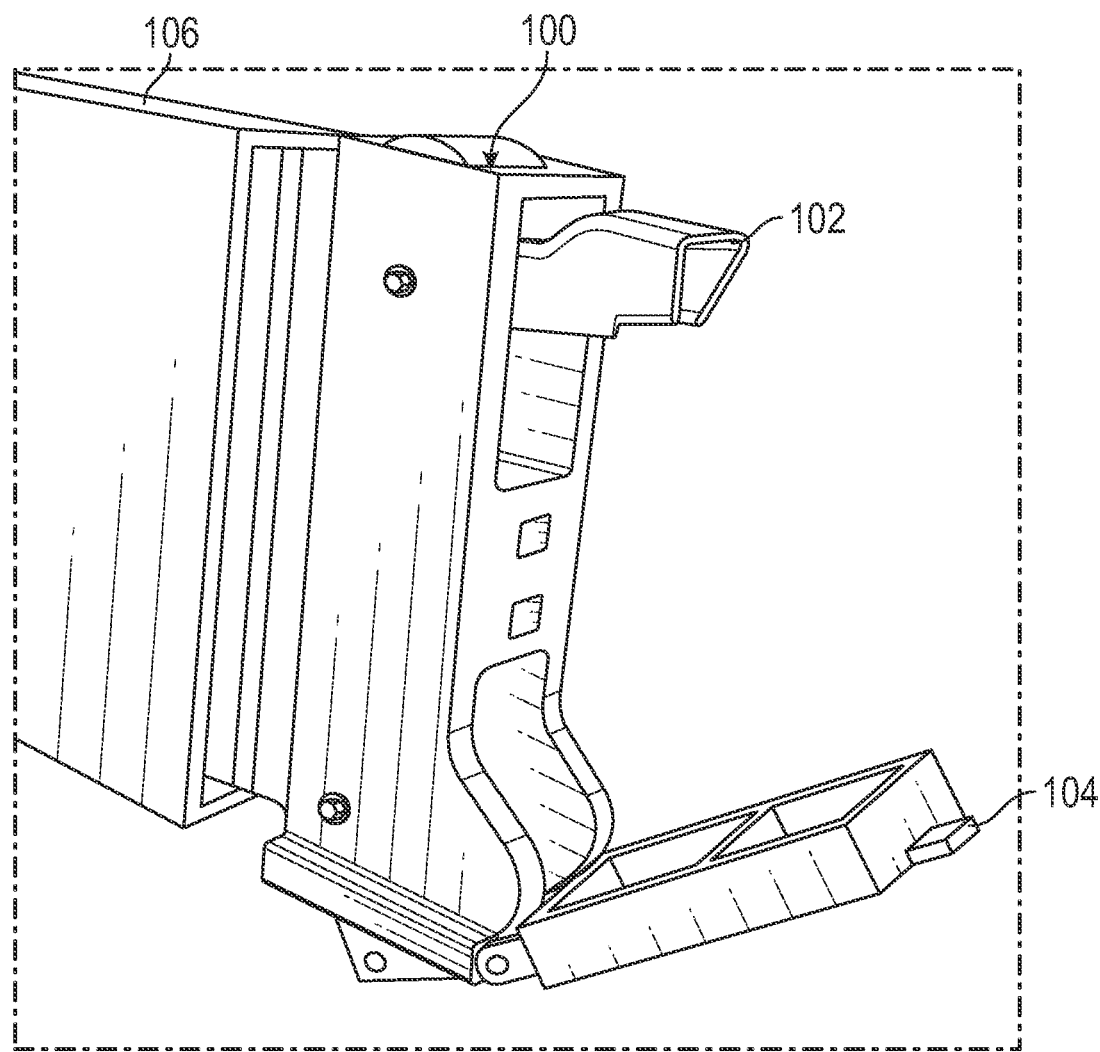
FIG. 1 illustrates a prior art latch.
Figure 2B:
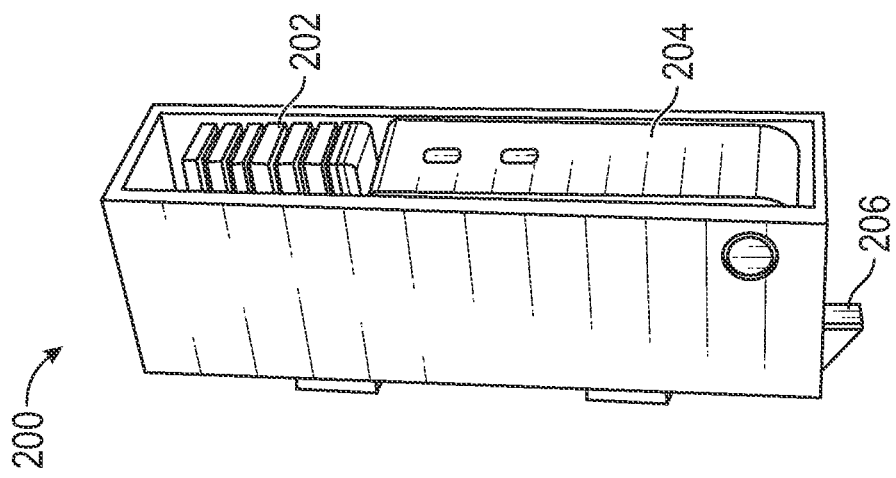
FIG. 2B illustrates the prior art latch of FIG. 2A in a second state.
Figure 2A:
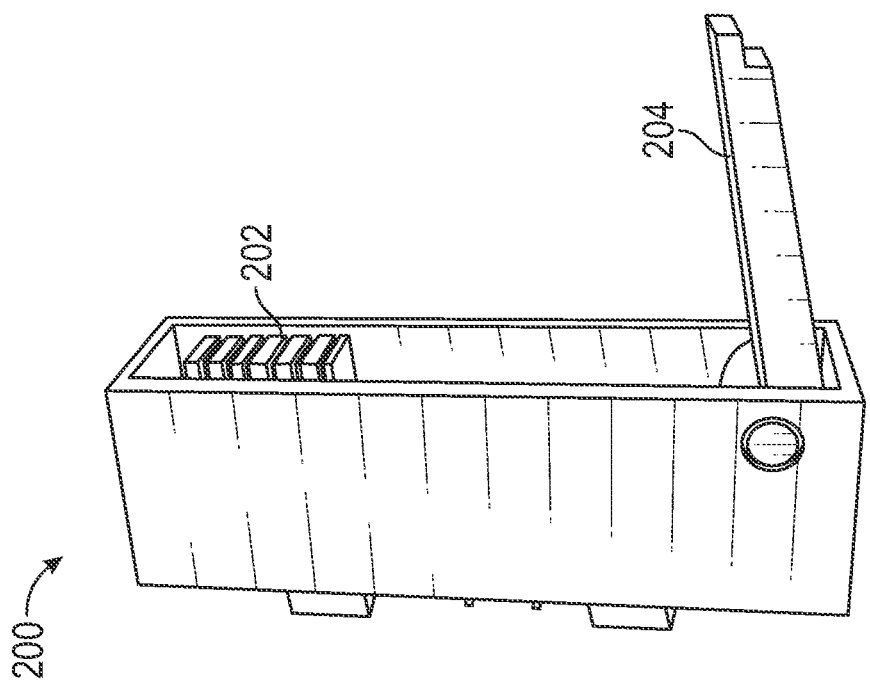
FIG. 2A illustrates a prior art latch in a first state.

In embodiments, a latch requires just one gesture to insert an electronic device (e.g., a ruler SSD) into a chassis, effect the electrical connection, and latch the device in place. In an embodiment, a latch features a handle that is supported by and moves within a housing. Such an embodiment is structurally more robust than the exposed latches of FIG. 1 and FIG. 2A, which may bend or break when the arm is loaded with large forces, a major disadvantage of a class 1 lever. In an embodiment, a compression-spring-loaded cam mechanism activated by a push button (e.g., a handle) engages and disengages a latch hook. For durability, major components like the housing, handle, and latch hook may be made of die-cast zinc alloy. With embodiments, to install a device within a chassis, the user need only feed the device into a chassis slot and keep pushing on the handle until device reaches the final position, the connectors mate, and the handle locks in the compressed state. In some embodiments, the spring load of the compression spring is greater than the frictional force required to achieve connection between the golden finger of the SSD and the connector. Thus, the device may be slid into a slot with the handle extended until the device bottoms out in the slot and the connection is made. Continued force causes the handle to depress with regard to the latch housing and lock in the depressed state. This ensures that the device is connected before the latch is engaged. To remove the device, the user may push the handle, which causes the handle to pop out, signaling the unlatching of the hook. The user may then use the handle to pull the device out of the chassis.

Figure 3:
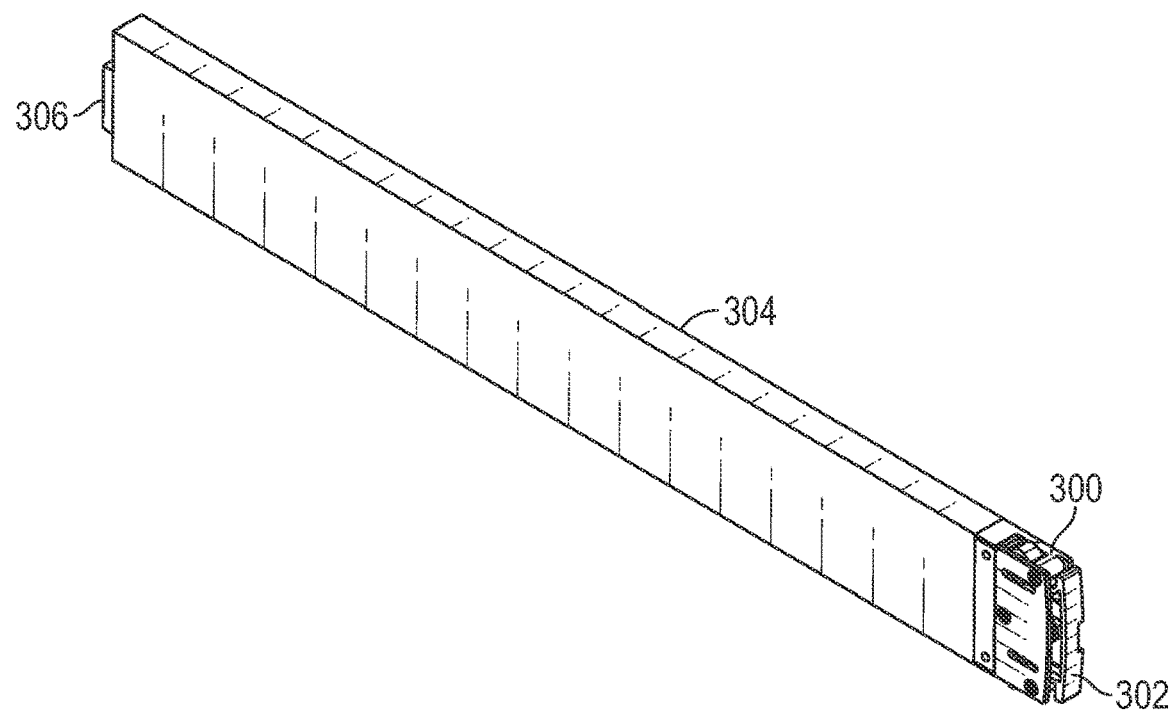
FIG. 3 is an upper left front perspective view of an embodiment of a latch attached to an exemplary electronic device.

FIG. 3 is an upper left front perspective view of an embodiment of a latch 300 attached to an exemplary electronic device 304, e.g., a ruler SSD. In FIG. 3, latch 300 includes a handle 302, which may also be embodied as a push button or lever. Device 304 includes a connector 306 at the end opposite connector 300.

Figure 4:
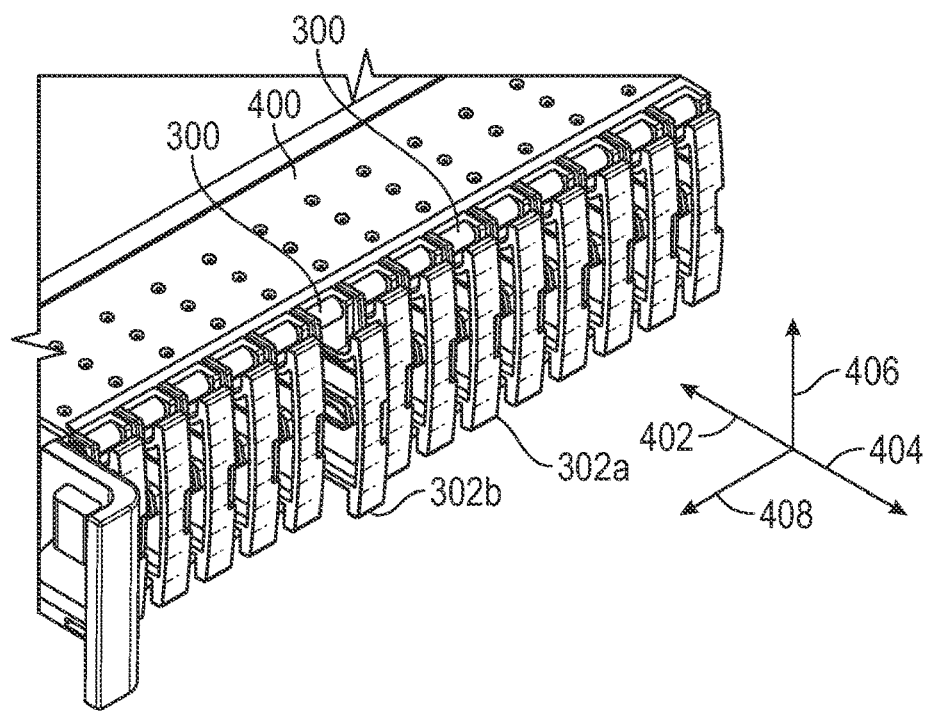
FIG. 4 is an upper left front perspective view of multiple devices equipped with the embodiment of the latch of FIG. 3 and within a chassis.
Figure 9:
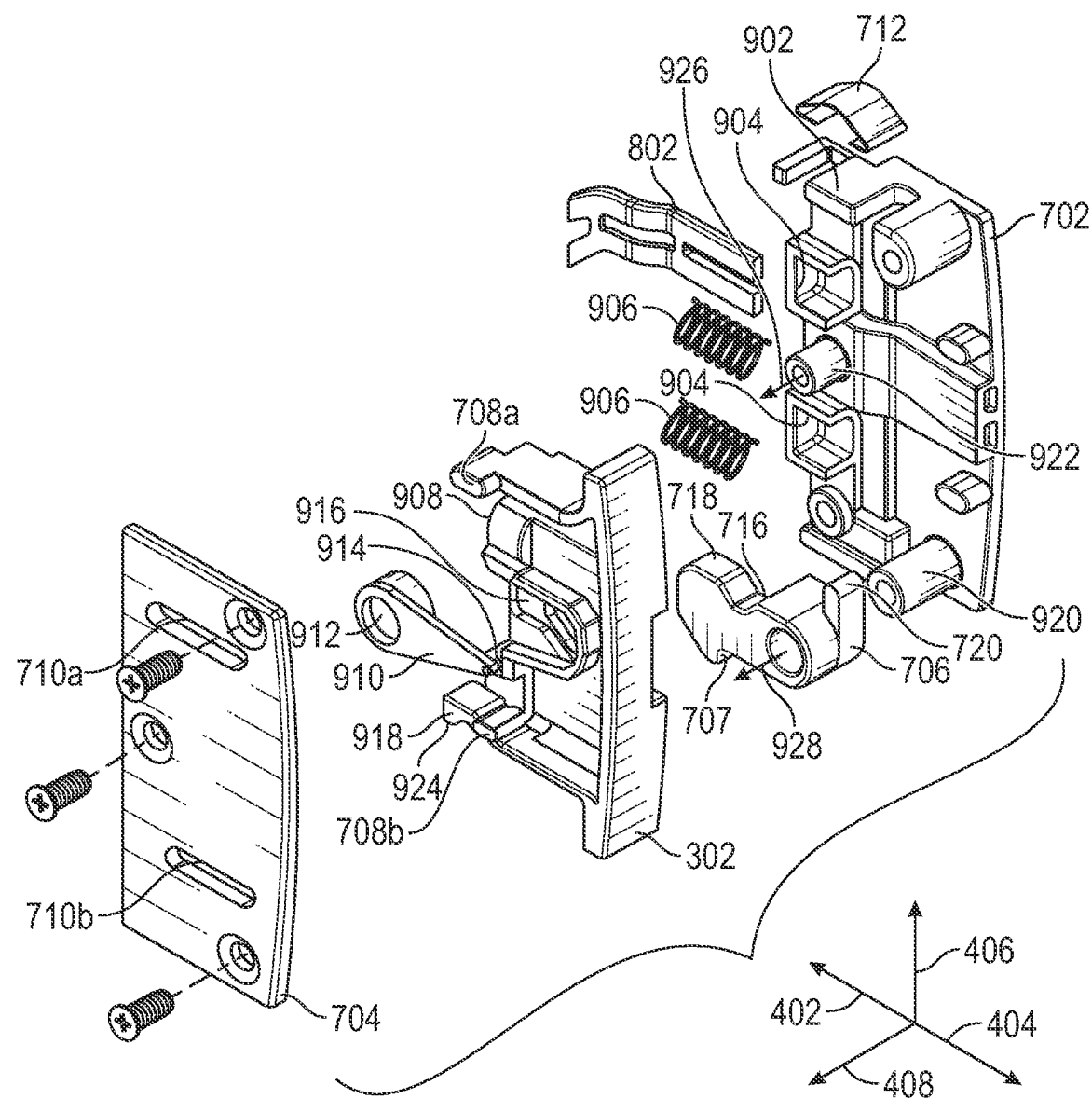
FIG. 9 is an upper left front assembly view of the embodiment of the latch of FIG. 3.

FIG. 4 is an upper left front perspective view of multiple devices 304 (not visible) equipped with latches 300. In FIG. 4, a chassis 400 houses a number of devices 304. With one of the devices, a handle 302a is depressed in an insertion direction 402 to a first retracted position (also the position of handle 302 in FIG. 11F), indicating that the latch is engaged. In this latched position, the device may not easily be removed. With a second of the devices, a handle 302b is extended in an extraction direction 404 to a first extended position (also the position of handle 302 in FIG. 11B), indicating that the latch is disengaged. In this unlatched position, the device may be easily removed. It may be seen by comparing FIG. 4 to FIG. 3 that both device 304 and at least some of latch 300 are configured to fit within a slot defined by chassis 400 and neighboring devices and latches. In FIG. 4, handle 302 is elongate in a first direction 406 and relatively narrower in a second direction 408, with second direction 408 being orthogonal to first direction 406 and parallel to first and second axes 926, 928 (FIG. 9). Handle 302b slides with respect to the housing in a third direction (insertion direction 402) orthogonal to both the first and second directions 406, 408.

Figure 5:
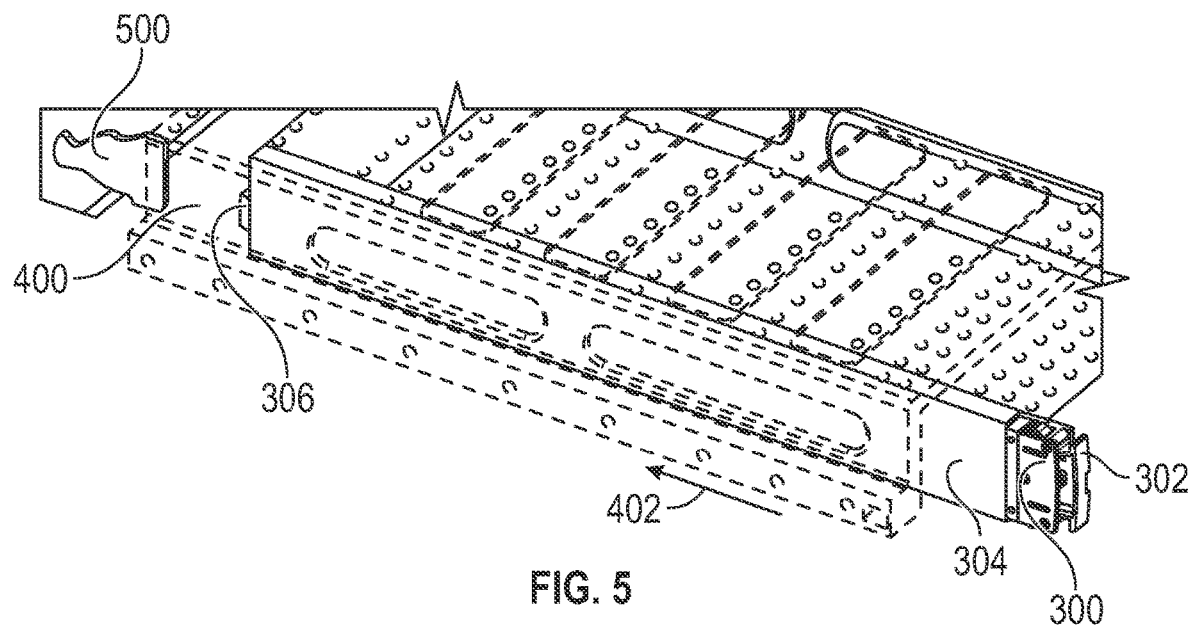
FIG. 5 is a partially-transparent, upper left front perspective view of the embodiment of the latch of FIG. 3 attached to the device and unlatched.

FIG. 5 is a partially-transparent, upper left front perspective view of latch 300 attached to device 304 in an unconnected and unlatched state. In FIG. 5, connector 306 has not yet been mated to a corresponding connector 500. Handle 302 is shown in the extended, unlatched position. Latch 300 includes a spring (e.g., springs 906 (each a first spring), FIG. 9) that exerts a force that is stronger than both the friction force of inserting device 304 and the mating force required by connectors 306, 500. Thus, Handle 302 will remain in the extended, unlatched position until connectors 306, 500 are properly mated and enough additional force is applied that the spring force is overcome.

Figure 6:
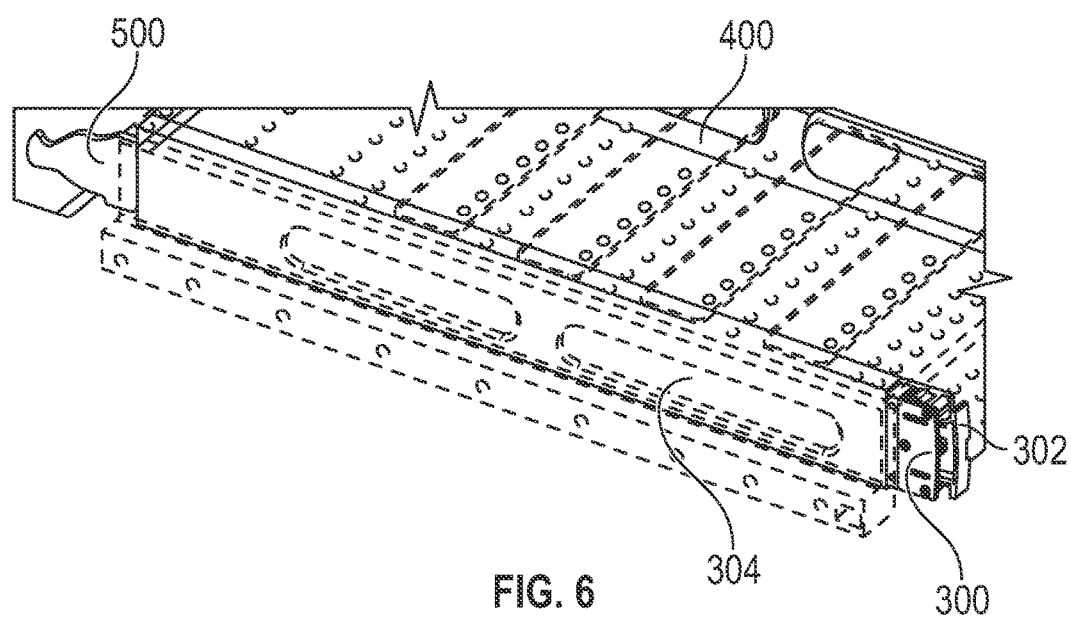
FIG. 6 is a partially-transparent, upper left front perspective view of the embodiment of the latch of FIG. 3 attached to the device and latched.

FIG. 6 is a partially-transparent, upper left front perspective view of latch 300 attached to device 304 in a connected and latched state. In FIG. 6, handle 302 has been depressed with a force sufficient to seat and mate connectors 306, 500 and then overcome the internal spring force.

Figure 7:
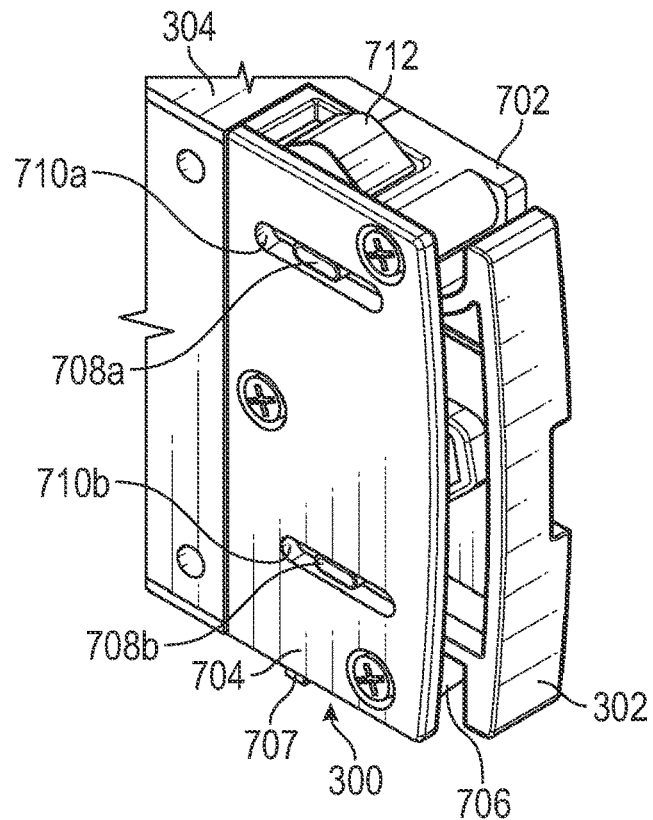
FIG. 7 is an upper left front perspective view of the embodiment of the latch of FIG. 3 attached to the device and latched.

FIG. 7 is an upper left front perspective view of latch 300 attached to device 304 and in a latched state. In FIG. 7, latch 300 is shown to include a housing 702 and a cover 704 that sandwich handle 302 between them. Latch 300 is attached to device 304 at housing 702. Also sandwiched between housing 702 and cover 704 is a latch arm 706 (a third arm) that ends with a latch tooth 707 (a second tooth). The combination of latch arm 706 and tooth 707 may be referred to as a latch hook. When moved from the unlatched to latched state, handle 302 causes tooth 707 to extend downward (as shown) from housing 702. Tooth 707 may then engage the edge of a corresponding window of chassis 400 to retain the latch/device assembly within chassis 400. Handle 302 further includes slightly elongated guide posts 708a, 708b that slide slots 710a, 710b, respectively of cover 704. Handle 302 is constrained by the sliding of posts 708a,b within slots 710a,b, and by being sandwiched between housing 702 and cover 704, to move linearly fore and aft with respect to device 304. Latch 300 may further include an electromagnetic interference (EMI) spring 712 that contacts conductive elements of chassis 400 to ground latch 300 and device 304.

Figure 8:
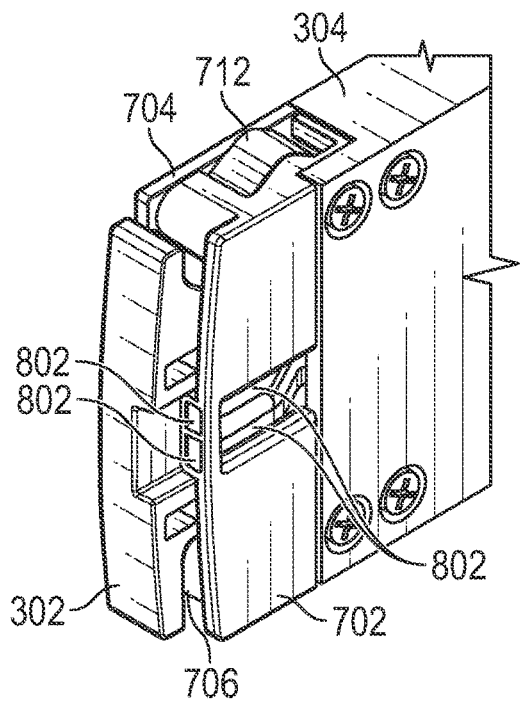
FIG. 8 is an upper right front perspective view of the embodiment of the latch of FIG. 3 attached to the device and latched.

FIG. 8 is an upper front right perspective view of latch 300 attached to device 304 and in a latched state. In FIG. 8, housing 702 is shown to include light pipes 802, which may be optically connected to lights, e.g., LEDs, of device 304 to provide indication of device connection or other activity.

FIG. 9 is an upper left front assembly view of latch 300. In FIG. 9, latch arm 706 (a third arm) further includes a recess 716 and a ridge 718 on the side opposite tooth 707 (a second tooth). Latch arm 706 slides over a post 920 when assembled and is constrained to rotate about post 920 between a position in which tooth 707 is retracted within the housing 702 and cover 704, and a position in which tooth 707 is extended and may engage a window in chassis 400 (i.e., post 920 defines a second axis 928 about which latch arm (a third arm) 706 rotates). Housing 702 is shown to include an EMI spring tab 902 and spring seats 904. EMI spring 712 may be positioned about EMI spring tab 902 and held in place by cover 704. Spring seats 904 may be fitted with springs 906 (each a first spring) that, upon assembly, are accepted by spring seats 908 of handle 302. Springs 906 are thereby compressed between housing 702 and handle 302 and work to urge handle 302 to the extended position unless handle 302 is acted upon by a superior force. In an embodiment, springs 906 exert a combined force of 3 lbs. against handle 302 in the unlatched, extended position, thus ensuring proper connection for connectors (e.g., connectors 306, 500) requiring mating forces of less than 3 lbs. Handle 302 is further shown to include a groove 916 (or "cam tooth path" or "serpentine loop"). With handle 302 and springs 906 assembled onto housing 702, a cam arm 910 (a second arm) is added by sliding a cam hole 912 over a post 922 of housing 702. Arm 910 is eventually held in place by cover 704 and constrained to rotate about post 922. Arm 910 includes a cam tooth 914 (a first tooth) configured to be received by groove 916. When assembled, with fore/aft movement of handle 302, arm 910 is held in position by post 922 of housing 702 and does not move fore/aft with respect to housing 702. However, arm 910 may rotate about post 922 (i.e., post 922 defines a first axis 926 about which cam arm (a second arm) 910 rotates). Thus, when assembled, tooth 914 is received within groove 916 and, with fore/aft movement of handle 302, tooth 914 traces the path of groove 916. Handle 302 is further shown to include a cantilevered arm 918 (a first arm) that extends beyond elongated guide post 708b. With fore/aft movement of handle 302, a tip 924 (a third tooth) of arm 918 rides against the top of latch arm 706 and travels back and forth between recess 716 and ridge 718. With handle 302 in the latched position, arm 918 contacts ridge 718, holding tooth 707 in the extended position. Thus, arm 918 acts as a hard stopper to hold tooth 707 in the latched position to keep the device within the chassis, e.g., during random vibrations or even seismic events.

Figure 11A:
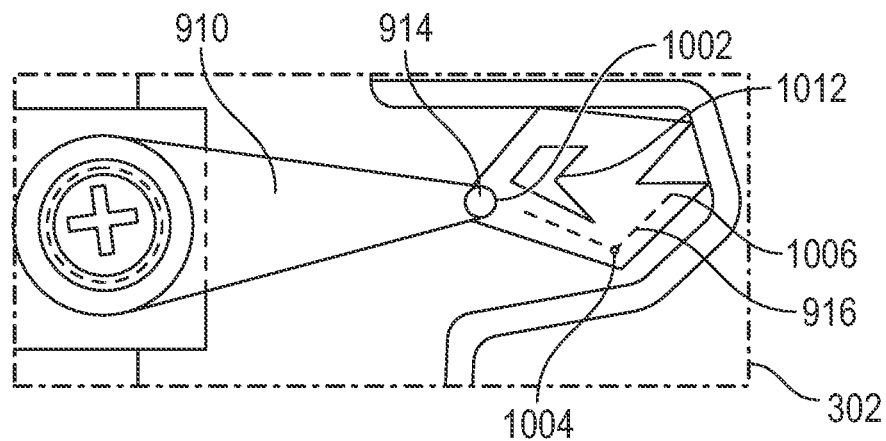
FIG. 11A is a partial right-side view of elements of the latch of FIG. 3 in a first position.
Figure 11B:
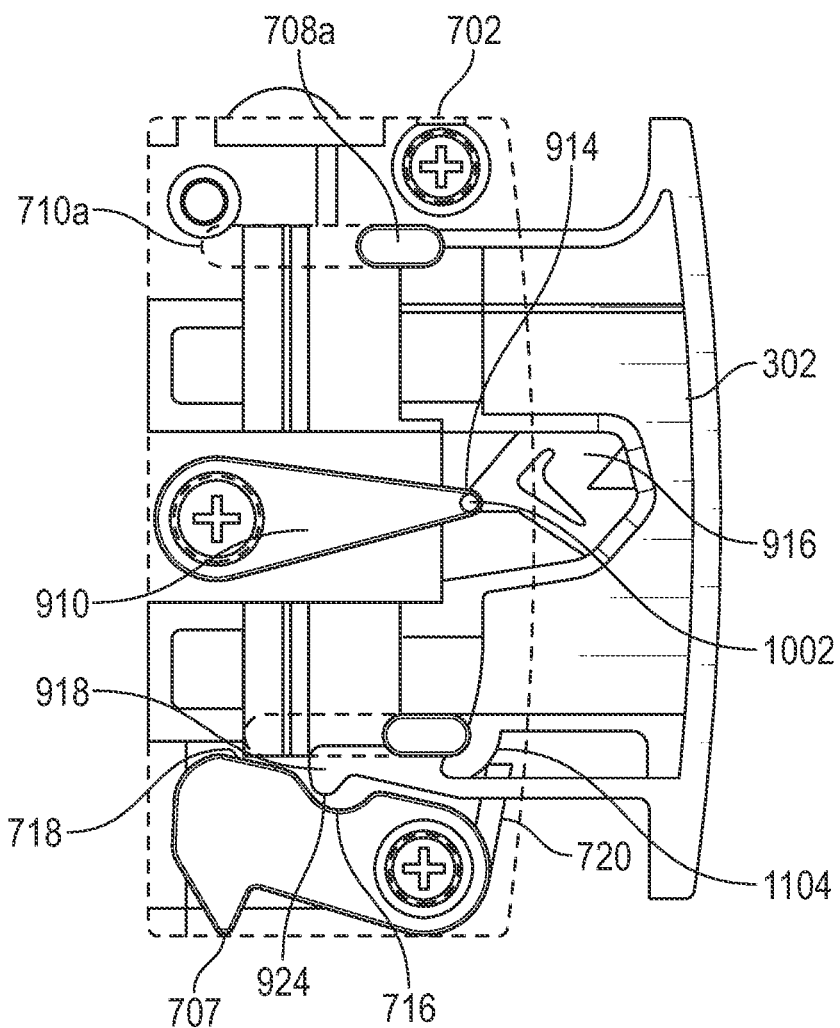
FIG. 11B is a partially transparent right-side view of the latch of FIG. 3 in the position of FIG. 11A.
Figure 11C:
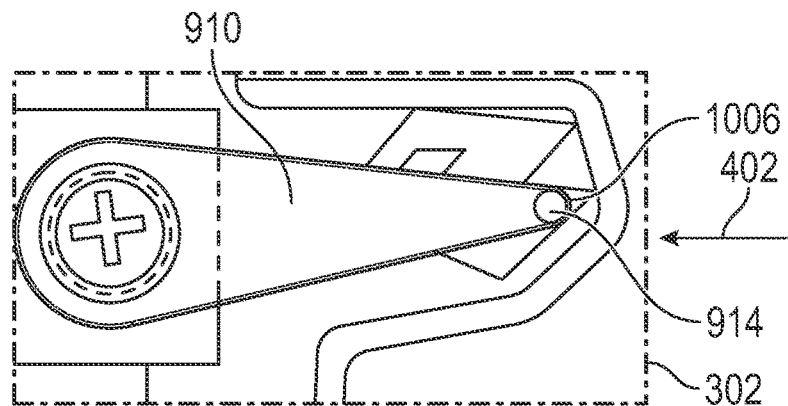
FIG. 11C is a partial right-side view of elements of the latch of FIG. 3 in a second position.
Figure 11D:
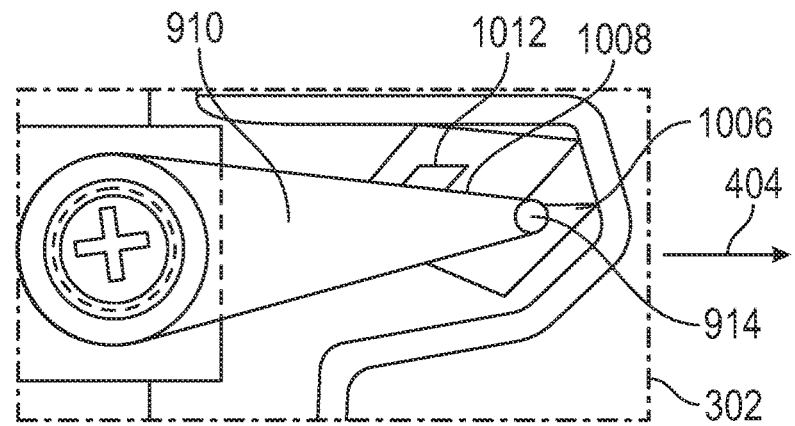
FIG. 11D is a partial right-side view of elements of the latch of FIG. 3 in a third position.
Figure 11E:
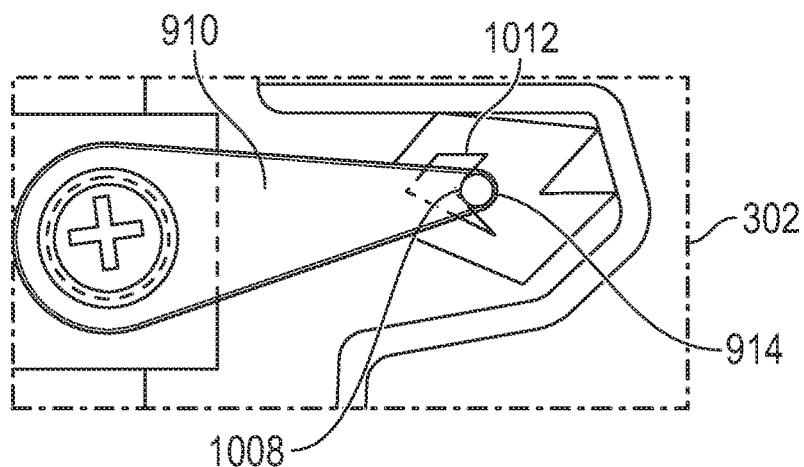
FIG. 11E is a partial right-side view of elements of the latch of FIG. 3 in a fourth position.
Figure 11F:
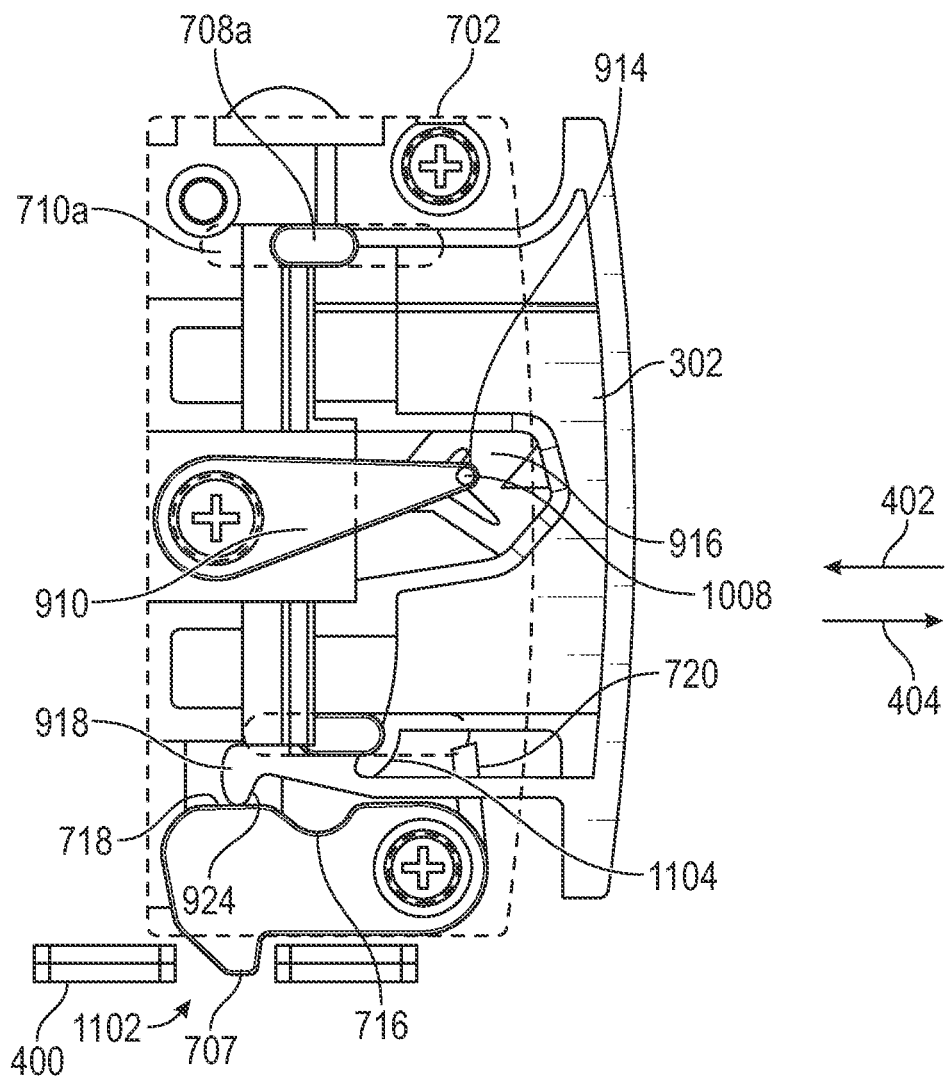
FIG. 11F is a partially transparent right-side view of the latch of FIG. 3 in the position of FIG. 11E.

With handle 302 in the extended, unlatched position, arm 918 is above recess 716, allowing latch arm 706 to rotate up and withdraw tooth 707 from the extended position of FIG. 11F (a second extended position) to the retracted position of FIG. 11B (a second retracted position). The clockwise rotation of latch arm 706 is caused by the extension of handle 302—when handle 302 extends, a shoulder 1104 (FIG. 11B, FIG. 11F) of handle 302 abuts a tab 720 of latch arm 706, causing latch arm 706 to rotate clockwise (as shown) with the extension of handle 302. Conversely, latch arm 706 rotates counter-clockwise with the compression of handle 302 as arm 918 moves over ridge 718.

Figure 10:
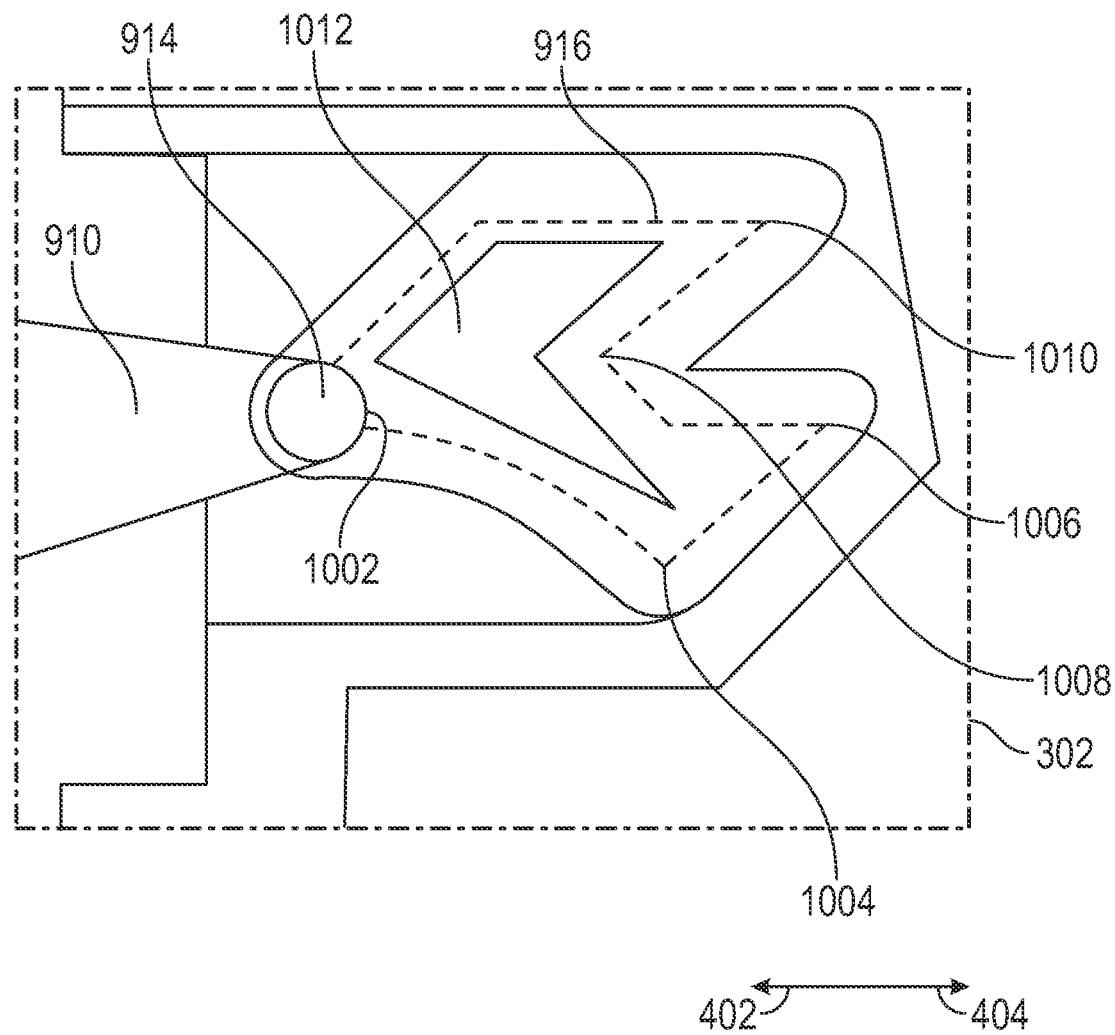
FIG. 10 is a right-side view of elements of the latch of FIG. 3.

FIG. 10 is a right-side view of groove 916 of handle 302. In FIG. 10, cam arm 910 is shown with cam tooth 914 in a position 1002 within groove 916. Groove 916 may be a flat path of uneven width about a raised island 1012. With tooth 914 at position 1002 (a first catch created by a first curve of groove 916), handle 302 is in the unlatched, extended position, and is held there by the force of springs 906. With depression of handle 302 in direction 402 to a fully-depressed state with respect to arm 910, tooth 914 follows groove 916 to a second position 1004 and continues on to a fully-depressed position 1006. Upon cessation of the compressive force, handle 302 will be urged by springs 906 in direction 404 and tooth 914 will travel to a latched position 1008 (a second catch created by a second curve of groove 916), created by a "cover" of island 1012, and is held there by the force of springs 906. In the latched position 1008, handle 302 is relatively more depressed than in the unlatched position of position 1002, but not as depressed as position 1006. With a subsequent depression, tooth 914 will travel from position 1008 to an intermediate compressed position 1010. Upon release of the compressive force, tooth 914 will travel from position 1010 back to unlatched position 1002. Thus, positions 1004, 1006, and 1010 may be considered as transitional tooth positions. While the embodiment describes the travel of tooth 914 as being within a groove, groove 916 may be embodied in other ways, so long as there are two places that catch tooth 914—a first catch (position 1002) that allows handle 302 to extend and a second catch (position 1008) that maintains handle 302 in a depressed position, where the distance between the two catches is the distance required to move latch arm 918 between recess 716 and ridge 718. In the embodiment, cam arm 910 relies upon friction to maintain position (horizontal position as shown) when moving away from position 1006, or from position 1008, so that tooth 914 does not drop toward position 1004. Similarly, cam arm 910 relies upon friction when moving from position 1010 so that tooth 914 does not drop toward position 1008. In embodiments, the friction may be found between cam hole 912 and post 922 or between cam arm 910 and cover 704 or both. Motion against the side of groove 916 is sufficient to overcome the friction and move tooth 914 up from position 1004 to position 1006, and from position 1008 to position 1010. Similarly, motion against island 1012 is sufficient to overcome friction and move tooth 914 from position 1006 up to position 1008.

Figure 11G:
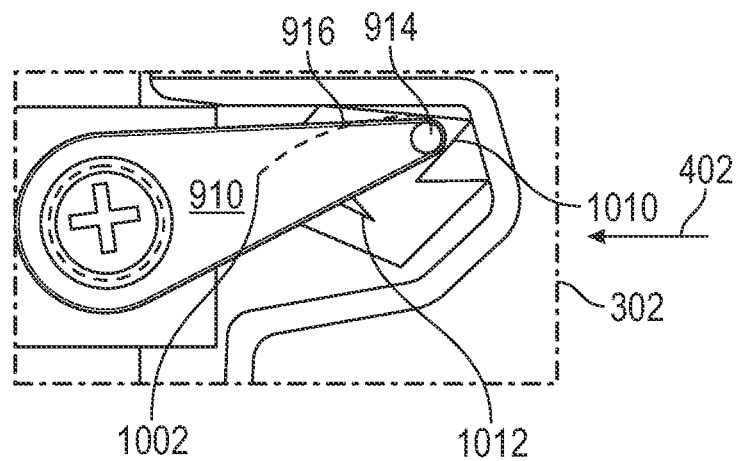
FIG. 11G is a partial right-side view of elements of the latch of FIG. 3 in a fifth position.

FIG. 11A-FIG. 11F are partial right-side views that illustrate the functional phases of latch 300 in more detail. In FIG. 11A, latch 300 is unlatched. Cam arm 910 is shown with cam tooth 914 in unlatched position 1002 of groove 916. With tooth 914 at position 1002, handle 302 is in the unlatched, first extended position, and is held there by the force of springs 906, as shown in FIG. 11B. FIG. 11B further illustrates that shoulder 1104 is against tab 720 and tip 924 of cantilevered arm 918 is received within recess 716. Subsequently, as shown in FIG. 11C, a compressive force applied in direction 402 has moved handle 302 to fully-depressed position 1006. This fully-depressed position indicates that the force of springs 906 has been overcome and connectors 306, 500 (FIG. 5) are correctly mated. Then, in FIG. 11D, with the release of external force, springs 906 urge handle 302 in direction 404, which causes tooth 914 to travel from position 1006 to latched position 1008. FIG. 11E and FIG. 11F illustrate tooth 914 caught by island 1012 in position 1008. In FIG. 11F, with cam tooth 914 in latched position 1008, latch tooth 707 is shown to extend from (emerge below) housing 702 and through a window 1102 of chassis 400, engaging an edge of window 1102 if latch 300 is moved in direction 404. In this manner, latch tooth 707 prevents latch 300 and device 304 from being withdrawn from chassis 400 in direction 404. FIG. 11F further illustrates that shoulder 1104 is withdrawn from tab 720 and tip 924 of cantilevered arm 918 abuts ridge 718, hindering the retraction of tooth 707 from window 1102. In the embodiment, when handle 302 is depressed in direction 402, the movement of the arm 918 against the side of recess 716 forces and over ridge 718 latch arm 706 to rotate counterclockwise and extend tooth 707 from housing 702 to the extended position shown in FIG. 11F, (a second extended position). With a subsequent compression of handle 302 in direction 402, as shown in FIG. 11G, tooth 914 will travel from position 1008 (FIG. 11F) to intermediate compressed position 1010. Upon release of the compressive force, tooth 914 will travel from position 1010 along groove 916 back to unlatched position 1002 and the configuration of FIG. 11A.

In an embodiment, tooth 707 may be affixed to the end of a sliding block that travels linearly up and down within handle 302. The block may be biased away from window 1102 by a spring and forced downward by movement in direction 402 of arm 918 against a ramp atop the block. In an embodiment, latch arm 706 may pivot about a vertical axis so that tooth 707 emerges from the side of cover 702 rather than below, with arm 918 working against a ramp atop the horizontal arm to cause horizontal movement. Similarly, in an embodiment, groove 916 and cam arm 910 may be oriented in a plane different from the vertical plane shown without departing from this disclosure. Furthermore, in an embodiment, the actuation achieved by the sliding action of handle 302 may be effectuated by having handle 302 pivot, e.g., about an axis that replaces guide 708a such that arm 918 moves in an arc rather than linearly.

The previous description is provided to enable any person skilled in the art to practice the various aspects described herein. In the embodiments, the separation of various system components in the embodiments described above should not be understood as requiring such separation in all embodiments. Various modifications to these aspects will be readily apparent to those skilled in the art, and the generic principles defined herein may be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

A phrase such as an "aspect" does not imply that such aspect is essential to the subject technology or that such aspect applies to all configurations of the subject technology. A disclosure relating to an aspect may apply to all configurations, or one or more configurations. A phrase such as an aspect may refer to one or more aspects and vice versa. A phrase such as a "configuration" does not imply that such configuration is essential to the subject technology or that such configuration applies to all configurations of the subject technology. A disclosure relating to a configuration may apply to all configurations, or one or more configurations. A phrase such as a configuration may refer to one or more configurations and vice versa.

All structural and functional equivalents to the elements of the various aspects described throughout this disclosure that are known or later come to be known to those of ordinary skill in the art are expressly incorporated herein by reference and are intended to be encompassed by the claims.

What is claimed is:

1. An apparatus comprising:
   a housing;
   a handle attached to the housing and movable between a first retracted position and a first extended position with respect to the housing;
   a first arm extending from the handle;
   a groove disposed in the handle and including a first catch and a second catch;
   a first spring disposed between the housing and handle such that the handle is urged toward the first extended position;
   a second arm pivotable with respect to the housing about a first axis, the second arm including a first tooth disposed on the second arm to be positioned within the groove; and
   a third arm movable between a second retracted position and a second extended position with respect to the housing and including a second tooth on a first side of the third arm and a recess on a second side of the third arm, the second tooth extending from the housing when the third arm is in the second extended position, wherein:

the groove defines a first plane that is perpendicular to the first axis and when the handle moves with respect to the first tooth the second arm pivots about the first axis and the first tooth travels within the groove;

when the handle moves to the first extended position the first tooth seats in the first catch position, the first arm moves into the recess, and a shoulder of the handle moves the third arm to the second retracted position; and when the handle moves to the first retracted position the first tooth seats in the second catch position and the first arm moves from the recess and urges the third arm toward the second extended position.

2. The apparatus of claim 1, wherein the third arm rotates about a second axis when the third arm moves between the second retracted position and the second extended position.

3. The apparatus of claim 2, wherein the first axis and second axis are parallel.

4. The apparatus of claim 3, wherein the movement of the third arm is in a second plane parallel to the first plane.

5. The apparatus of claim 1, wherein the first arm includes a third tooth configured to fit within the recess when the handle is in the first extended position and to have exited the recess when the handle is in the first retracted position.

6. The apparatus of claim 5, wherein a first side of the third tooth moves against a second side of the recess when the handle moves from the first extended position to the first retracted position.

7. The apparatus of claim 1, wherein the second tooth is extended from the housing in a latching position when the third arm is in the second extended position.

8. The apparatus of claim 1, wherein the groove forms a serpentine loop with the first catch including a first curve of the serpentine loop and the second catch including a second curve of the serpentine loop.

9. The apparatus of claim 8, wherein a width of the groove is not constant and a bottom of the groove is flat.

10. The apparatus of claim 1, wherein the first tooth is at an end of the second arm distal to the first axis.

11. The apparatus of claim 1, wherein an elongate member sliding within a slot contributes to constraining the movement of the handle with respect to the housing.

12. The apparatus of claim 11, wherein:

the first and second axes are parallel and the handle is elongate in a first direction and relatively narrower in a second direction, the second direction orthogonal to the first direction and parallel to the first and second axes;

the handle slides with respect to the housing in a third direction orthogonal to both the first and second directions; and the second tooth extends from the housing in the first direction.

13. The apparatus of claim 1 further comprising an electronic device attached to the housing, the electronic device including an electrical connector at an end opposite housing, the electronic device and at least part of the housing configured to fit within a slot of a chassis.

* * * * *